(12) United States Patent
Granger-Jones et al.

(10) Patent No.: US 10,536,150 B1
(45) Date of Patent: Jan. 14, 2020

(54) MICROELECTROMECHANICAL SYSTEMS-BASED LOGIC GATES

(71) Applicant: Qorvo US, Inc., Greensboro, NC (US)

(72) Inventors: Marcus Granger-Jones, Scotts Valley, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/354,854

(22) Filed: Mar. 15, 2019

(51) Int. Cl.
*H03K 19/20* (2006.01)
*B81B 7/02* (2006.01)

(52) U.S. Cl.
CPC .............. *H03K 19/20* (2013.01); *B81B 7/02* (2013.01); *B81B 2201/01* (2013.01)

(58) Field of Classification Search
CPC ........ H03K 19/20; B81B 7/02; B81B 2201/01
USPC ........................................................ 326/104
See application file for complete search history.

(56) References Cited

U.S. PATENT DOCUMENTS

| | | | | |
|---|---|---|---|---|
| 5,638,946 A * | 6/1997 | Zavracky | ............... | G11C 23/00 200/181 |
| 6,548,841 B2 * | 4/2003 | Frazier | .................. | G11C 23/00 257/254 |
| 7,355,258 B2 * | 4/2008 | Valenzuela | ............. | G11C 11/50 200/181 |
| 7,719,318 B1 * | 5/2010 | Nordquist | .............. | G11C 23/00 257/415 |
| 9,276,579 B2 * | 3/2016 | Despont | ................. | H03K 19/20 |
| 2007/0134835 A1 * | 6/2007 | Fukuda | ............. | H01H 59/0009 438/48 |
| 2009/0134522 A1 * | 5/2009 | Smith | ..................... | B81B 3/001 257/769 |
| 2015/0075957 A1 * | 3/2015 | Frankel | ............. | H01H 59/0009 200/5 A |

OTHER PUBLICATIONS

Scotts et al., U.S. Appl. No. 16/354,842, filed Mar. 15, 2019.*
Author Unknown, "RF MEMS Switching: What You Need to Know," White Paper, Structure and Usage of OMRON MEMS Switch, 2SMES-01, 2013, OMRON Corporation, 13 pages.

* cited by examiner

*Primary Examiner* — Don P Le
(74) *Attorney, Agent, or Firm* — Withrow & Terranova, P.L.L.C.

(57) ABSTRACT

Disclosed is a microelectromechanical systems (MEMS) logic gate with a first logic MEMS switch having a first beam with a first switch contact, a first gate, and a first terminal contact, wherein the first beam is coupled to a fixed higher voltage node. The MEMS logic gate also includes a second logic MEMS switch having a second beam with a second switch contact, a second gate, and a second terminal contact, wherein the second beam is electrically coupled to a fixed lower voltage node. Further included is internal logic gate circuitry having a first input terminal and a first output terminal, wherein the internal logic gate circuitry is electrically coupled between the first terminal contact of the first logic MEMS switch and the second terminal contact of the second logic MEMS switch.

19 Claims, 10 Drawing Sheets

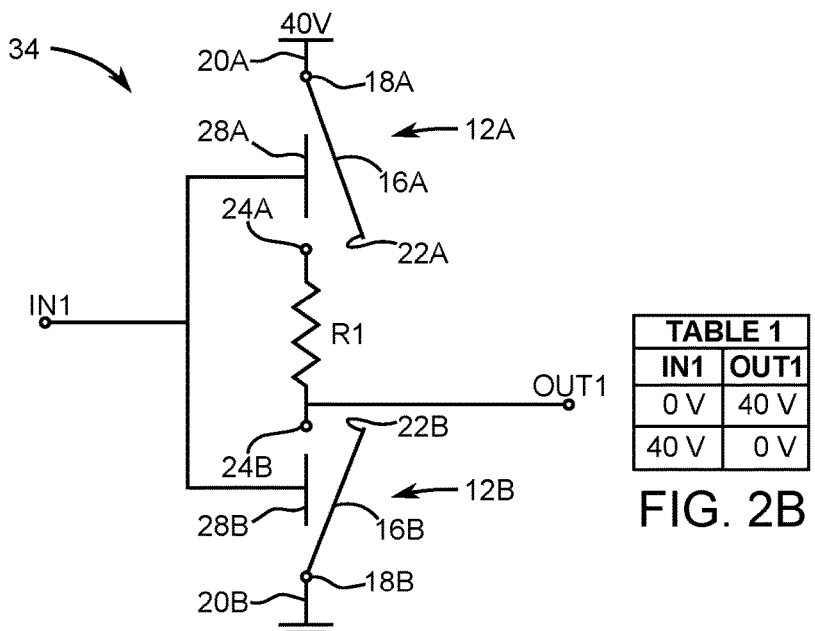
FIG. 2A
FIG. 2B
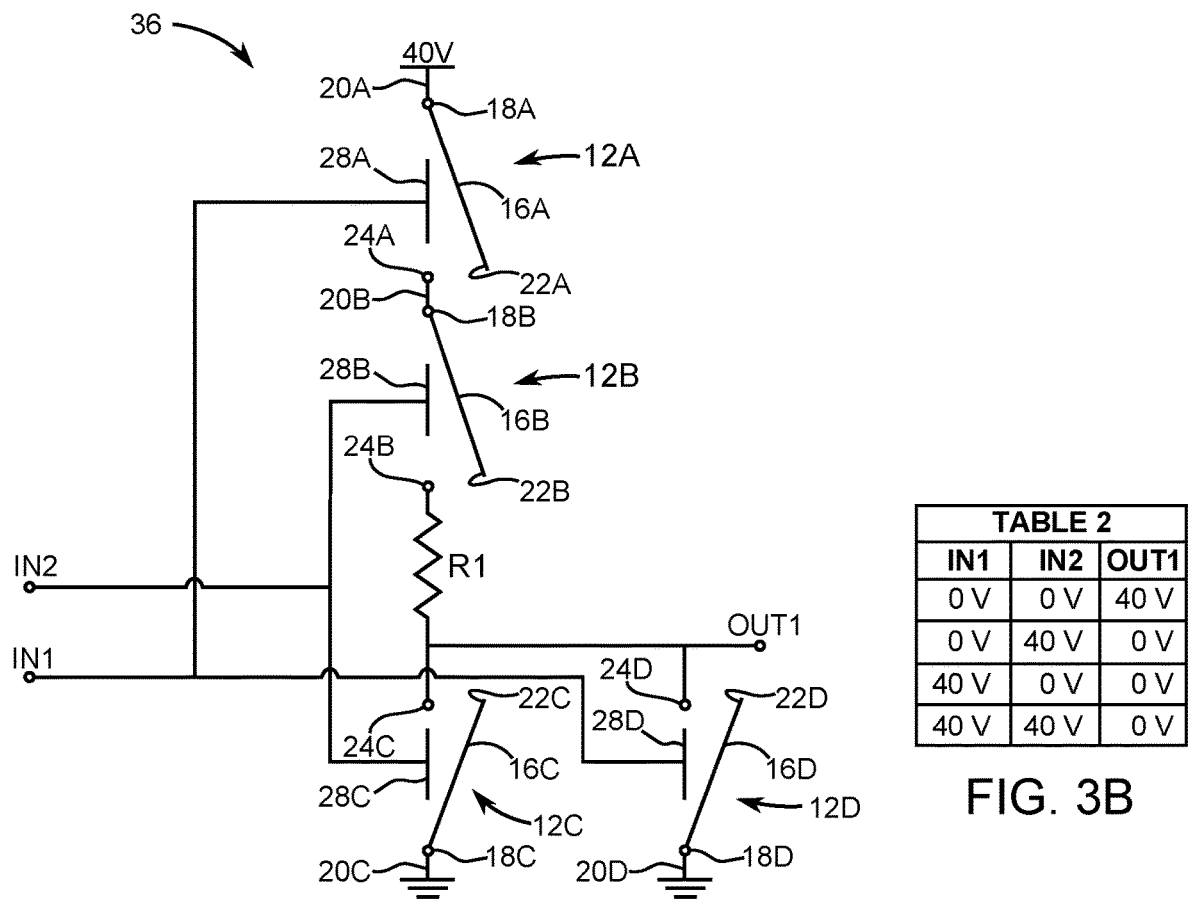
FIG. 3A
FIG. 3B

| TABLE 4 | | |
|---|---|---|
| IN1 | IN2 | OUT1 |
| 0 V | 0 V | 0 V |
| 0 V | 40 V | 0 V |
| 40 V | 0 V | 0 V |
| 40 V | 40 V | 40 V |

| TABLE 5 | | | | |
|---|---|---|---|---|
| GPO1 | GPO2 | GPO3 | GPO4 | SWITCH STATE |
| 0 | 0 | 0 | 0 | SW1-SW15 = OPEN |
| 1 | 0 | 0 | 0 | SW1 = CLOSED |
| 0 | 1 | 0 | 0 | SW2 = CLOSED |
| 1 | 1 | 0 | 0 | SW3 = CLOSED |
| 0 | 0 | 1 | 0 | SW4 = CLOSED |
| 1 | 0 | 1 | 0 | SW5 = CLOSED |
| 0 | 1 | 1 | 0 | SW6 = CLOSED |
| 1 | 1 | 1 | 0 | SW7 = CLOSED |
| 0 | 0 | 0 | 1 | SW8 = CLOSED |
| 1 | 0 | 0 | 1 | SW9 = CLOSED |
| 0 | 1 | 0 | 1 | SW10 = CLOSED |
| 1 | 1 | 0 | 1 | SW11 = CLOSED |
| 0 | 0 | 1 | 1 | SW12 = CLOSED |
| 1 | 0 | 1 | 1 | SW13 = CLOSED |
| 0 | 1 | 1 | 1 | SW14 = CLOSED |
| 1 | 1 | 1 | 1 | SW15 = CLOSED |

FIG. 7

| TABLE 6 ||||||
|---|---|---|---|---|---|
| GPO1 | GPO2 | GPO3 | GPO4 | SERIES SWITCHES SWITCH STATE | SHUNT SWITCHES SWITCH STATE |
| 0 | 0 | 0 | 0 | SW1-SW15 = OPEN | SS1-SS15 = CLOSED |
| 1 | 0 | 0 | 0 | SW1 = CLOSED | SS1 = OPEN |
| 0 | 1 | 0 | 0 | SW2 = CLOSED | SS2 = OPEN |
| 1 | 1 | 0 | 0 | SW3 = CLOSED | SS3 = OPEN |
| 0 | 0 | 1 | 0 | SW4 = CLOSED | SS4 = OPEN |
| 1 | 0 | 1 | 0 | SW5 = CLOSED | SS5 = OPEN |
| 0 | 1 | 1 | 0 | SW6 = CLOSED | SS6 = OPEN |
| 1 | 1 | 1 | 0 | SW7 = CLOSED | SS7 = OPEN |
| 0 | 0 | 0 | 1 | SW8 = CLOSED | SW8 = OPEN |
| 1 | 0 | 0 | 1 | SW9 = CLOSED | SS9 = OPEN |
| 0 | 1 | 0 | 1 | SW10 = CLOSED | SS10 = OPEN |
| 1 | 1 | 0 | 1 | SW11 = CLOSED | SS11 = OPEN |
| 0 | 0 | 1 | 1 | SW12 = CLOSED | SS12 = OPEN |
| 1 | 0 | 1 | 1 | SW13 = CLOSED | SS13 = OPEN |
| 0 | 1 | 1 | 1 | SW14 = CLOSED | SS14 = OPEN |
| 1 | 1 | 1 | 1 | SW15 = CLOSED | SS15 = OPEN |

MICROELECTROMECHANICAL SYSTEMS-BASED LOGIC GATES

RELATED APPLICATIONS

This application is related to U.S. patent application Ser. No. 16/354,842, filed Mar. 15, 2019, titled MICROELECTROMECHANICAL SYSTEMS SWITCH DIE, the disclosure of which is hereby incorporated herein by reference in its entirety.

FIELD OF THE DISCLOSURE

The present disclosure relates to microelectromechanical (MEMS) switches and in particular to implementations and applications of MEMS switches in digital logic functions.

BACKGROUND

As electronics evolve, there is an increased need for miniature switches that are provided on semiconductor substrates along with other semiconductor components to form various types of circuits. These miniature switches often act as relays and are generally referred to as microelectromechanical system (MEMS) switches. In many applications, MEMS switches may replace field-effect transistors (FETs) and are configured as switches to reduce insertion losses due to added resistance as well as parasitic capacitance and inductance inherent in providing FET switches in a signal path. MEMS switches are currently being considered in many radio frequency applications, such as antenna switches, load switches, transmit/receive switches, tuning switches, and the like because MEMS switches have a higher Ron*Coff figure of merit and are more linear than silicon-on-insulator complementary metal oxide switches.

SUMMARY

Disclosed is a microelectromechanical systems (MEMS) logic gate with a first logic MEMS switch having a first beam with a first switch contact, a first gate, and a first terminal contact, wherein the first beam is coupled to a fixed higher voltage node. The MEMS logic gate also includes a second logic MEMS switch having a second beam with a second switch contact, a second gate, and a second terminal contact, wherein the second beam is electrically coupled to a fixed lower voltage node. Further included is internal logic gate circuitry having a first input terminal and a first output terminal, wherein the internal logic gate circuitry is electrically coupled between the first terminal contact of the first logic MEMS switch and the second terminal contact of the second logic MEMS switch.

In some exemplary embodiments, the MEMS logic gate is integrated within a MEMS switch die. The MEMS switch die includes an N number of radio frequency (RF) MEMS switches, each having an RF beam with an RF switch contact, an RF gate, and an RF terminal contact, wherein N is a counting number. The MEMS switch die further includes a MEMS-based decoder having the first logic MEMS switch, the second logic MEMS switch, and the internal logic gate circuitry. The MEMS-based decoder is configured to decode coded signals to determine which of the N number of RF MEMS switches to open and close. The MEMS-based decoder is further configured to apply a higher gate voltage to each RF gate of the RF MEMS switches determined to be closed, wherein the higher gate voltage electrostatically pulls the RF beam and brings the RF switch contact into electrical contact with the RF terminal contact. The MEMS-based decoder is also further configured to apply a lower gate voltage to each RF gate of the RF MEMS switches to be opened, wherein the lower gate voltage releases the RF beam and allows the RF switch contact to break electrical contact with the RF terminal contact.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 2A is a schematic depicting an inverter logic gate made of a combination of MEMS switches.

FIG. 2B is a logic table that lists input states and output states for the inverter logic gate of FIG. 2A.

FIG. 3A is a schematic depicting a combination of MEMS switches that realizes a MEMS-based two-input NOR gate.

FIG. 3B is a logic table that lists input states and output states for the two-input NOR gate of FIG. 3A.

FIG. 7 is a truth table listing logic states of coded signals conveyed over control lines along with switch states for RF MEMS switches in response to the coded signals.

FIG. 10 is a truth table listing logic states of 16 coded signals conveyed over the four control lines along with switch states for 15 RF MEMS switches along with switch states for 15 shunt MEMS switches in response to the coded signals.

DETAILED DESCRIPTION

Figure 1A:
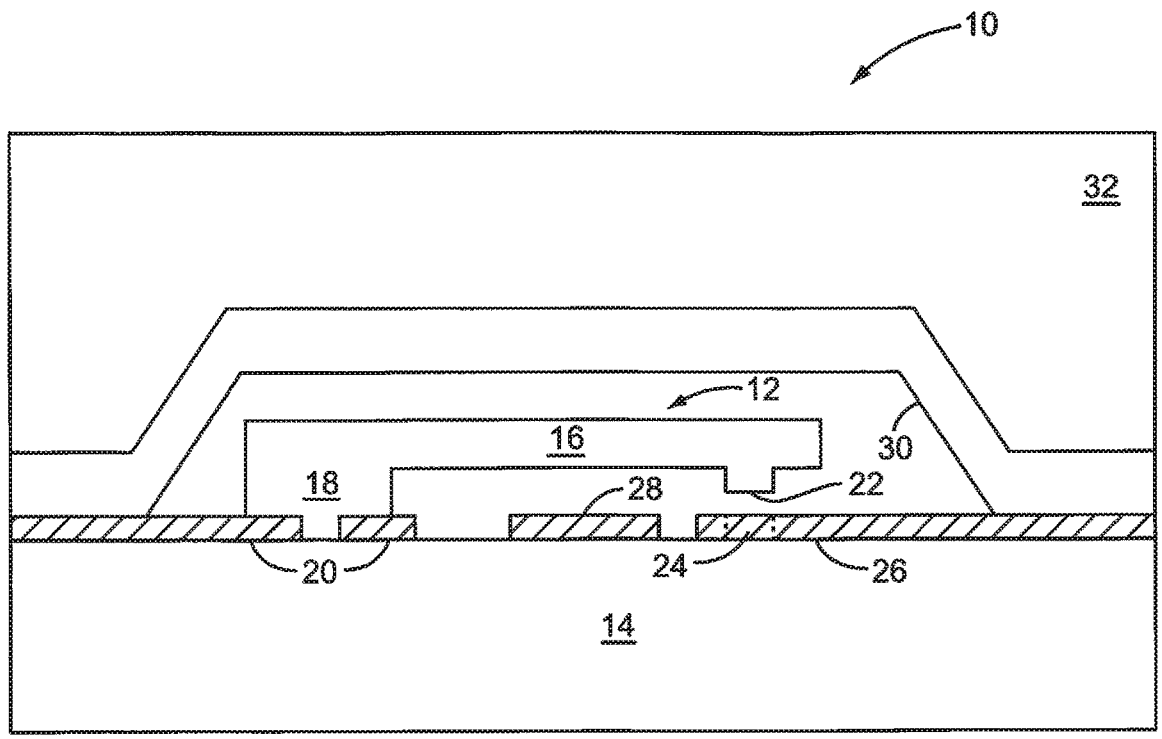
FIG. 1A is a cross-sectional view representative of a related-art microelectromechanical system (MEMS) switch in an open position.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
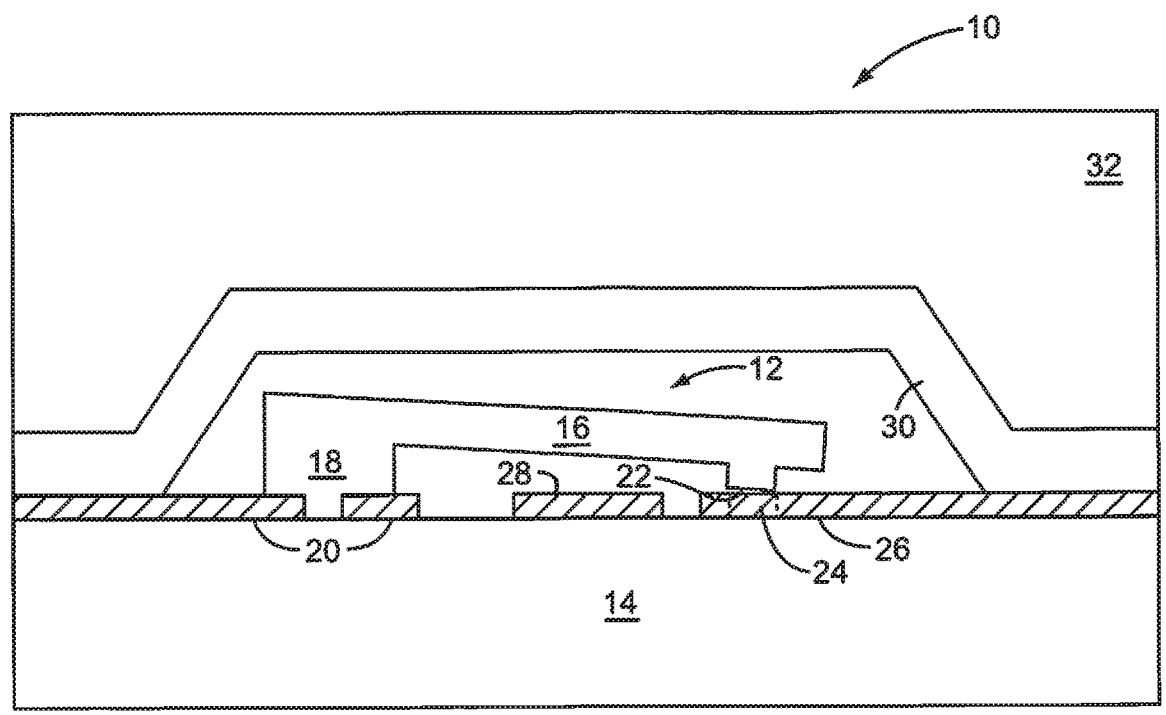
FIG. 1B is a cross-sectional view representative of the related-art MEMS switch of FIG. 1A in a closed position.

Before describing particular embodiments of the present disclosure, a general discussion of microelectromechanical systems (MEMS) switch devices is provided. Turning to FIG. 1A and FIG. 1B, a MEMS device 10 having a MEMS switch 12 is illustrated. The MEMS switch 12 is formed on an appropriate substrate 14. In certain embodiments, the substrate 14 may comprise a semiconductor or insulator substrate, examples of which may include silicon, glass, and glass-fiber composite materials. The MEMS switch 12 includes a beam 16, which is formed from a conductive material, such as gold. The beam 16 has a first end and a second end. The first end is coupled to the substrate 14 by an anchor 18. The first end of the beam 16 is also electrically coupled to a first conductive pad 20 at or near the point where the beam 16 is anchored to the substrate 14. Notably, the first conductive pad 20 may play a role in anchoring the first end of the beam 16 to the substrate 14 as depicted. The first conductive pad 20 may form a portion of or be connected to a first terminal (not shown) of the MEMS switch 12.

The second end of the beam 16 forms or is provided with a switch contact 22, which is suspended over a corresponding terminal contact 24 and/or a second conductive pad 26. The second conductive pad 26 may form a portion of or be connected to a second terminal (not shown) of the MEMS switch 12. Thus, when the MEMS switch 12 is actuated, the beam 16 moves the switch contact 22 into electrical contact with the terminal contact 24 of the second conductive pad 26 to electrically connect the first conductive pad 20 to the second conductive pad 26. To actuate the MEMS switch 12, and in particular to cause the beam 16 to move the switch contact 22 into contact with the terminal contact 24 of the second conductive pad 26, a gate electrode 28 is formed over a portion of the substrate 14, preferably under the middle portion of the beam 16. To actuate the MEMS switch 12, an electrostatic voltage is applied to the gate electrode 28. The presence of the electrostatic voltage creates an electrostatic field that effectively pulls the beam 16 against a restoring force toward the gate electrode 28 from an open position illustrated in FIG. 1A to a closed position illustrated in FIG. 1B. Removing the electrostatic voltage from the gate electrode 28 releases the beam 16 for return to the open position illustrated in FIG. 1A. As illustrated, the open position occurs when the switch contact 22 is out of contact with the terminal contact 24, and the closed position occurs when the switch contact 22 comes into contact with the terminal contact 24. The MEMS switch 12 may be encapsulated by one or more encapsulation layers 30, which form a substantially hermetically sealed cavity around the beam 16. The cavity is generally filled with an inert gas and sealed in a near vacuum state. Once the one or more encapsulation layers 30 are in place, an overmold 32 may be provided over the one or more encapsulation layers 30. In FIG. 1A and FIG. 1B, the beam 16 is illustrated as a cantilever wherein the first end is anchored and the second end is suspended. According to embodiments disclosed herein, the beam 16 may comprise other configurations as well, including a beam in which both ends are anchored and the beam flexes between the two ends.

In accordance with the present disclosure, MEMS switches such as the MEMS switch 12 depicted in FIG. 1A and FIG. 1B are combined to realize logic gates. For example, FIG. 2A is a schematic depicting a combination of a first MEMS switch 12A and a second MEMS switch 12B that realizes a MEMS-based inverter gate 34. In this particular combination, the MEMS switch 12A is analogous to a positive field-effect transistor and the second MEMS switch 12B is analogous to a negative field-effect transistor.

The first MEMS switch 12A includes a beam 16A having a fixed end attached to an anchor 18A. A conductive pad 20A is electrically coupled to the anchor 18A such that the beam 16A is energized by a supply voltage, which in this exemplary embodiment is 40 V. A free end of the beam 16A includes a switch contact 22A that is selectively pulled into electrical contact with a terminal contact 24A by electric static force generated by a voltage difference between a gate 28A and the beam 16A. When the switch contact 22A and the terminal contact 24A are in electrical contact, the first MEMS switch 12A is in the closed position. A voltage representing an input logic state of the MEMS-based inverter gate 34 is applied to the gate 28A though an input terminal IN1. An output terminal OUT1 is electrically coupled to the terminal contact 24A through an optional resistor R1, which may have a resistance value between a kilo-ohm and mega-ohm range to limit current flow through the first MEMS switch 12A and the second MEMS switch 12B when either is in the closed position. Voltage at the output terminal OUT1 represents an output logic state of the MEMS-based inverter gate 34. However, it is to be understood that the output terminal OUT1 may be electrically coupled directly to the terminal contact 24A without the optional resistor R1.

The second MEMS switch 12B includes a beam 16B having a fixed end attached to an anchor 18B. A conductive pad 20B is electrically coupled to the anchor 18B such that the beam 16B is held at a fixed voltage that is lower than the supply voltage. In this exemplary embodiment, the fixed voltage of the beam 16B is 0 V, which is depicted as ground. A free end of the beam 16B includes a switch contact 22B that is selectively pulled into electrical contact with a terminal contact 24B by electric static force generated by a voltage difference between a gate 28B and the beam 16B. When the switch contact 22B and the terminal contact 24B are in electrical contact, the second MEMS switch 12B is in the closed position. In this exemplary embodiment, the output terminal OUT1 is coupled directly to the terminal contact 24B. Voltage representing the input logic state is applied to the gate 28B though the input terminal IN1.

In operation, the beam 16A of the first MEMS switch 12A remains constantly energized with the supply voltage such as 40 V by way of the conductive pad 20A and the anchor 18A. In contrast, the beam 16B of the second MEMS switch 12B is constantly held to the lower fixed voltage such a ground that is at 0 V by way of the conductive pad 20B and the anchor 18B.

As depicted in a Table 1 of FIG. 2B, when an input logic state of 0 V is applied to the input terminal IN1, an output logic state of 40 V at an output terminal OUT1 results. In particular, the input logic state of 0 V results in a 0 V difference between the gate 28B and the beam 16B of the second MEMS switch 12B, thereby ensuring that the second MEMS switch 12B is in the open position. In contrast, the input logic state of 0 V results in a −40 V difference between the gate 28A and the beam 16A of the first MEMS switch 12A, thereby pulling the switch contact 22A into contact with the terminal contact 24A, which is the closed position for the first MEMS switch 12A. As such, an output logic state of 40 V, which in this embodiment is the inverted logic state of the input logic state of 0 V, is applied to the output terminal OUT1.

As further depicted in a Table 1 of FIG. 2B, when an input logic state of 40 V is applied to the input terminal IN1, an output logic state of 0 V at the output terminal OUT1 results. In particular, the input logic state of 40 V results in a 0 V difference between the gate 28A and the beam 16A of the first MEMS switch 12A, thereby ensuring that the first MEMS switch 12A is in the open position. In contrast, the input logic state of 40 V results in a 40 V difference between the gate 28B and the beam 16B of the second MEMS switch 12B, thereby pulling the switch contact 22B into contact with the terminal contact 24B, which is the closed position for the second MEMS switch 12B. As such, an output logic state of 0 V is applied to the output terminal OUT1 when the input logic state applied to the input terminal IN1 is 40 V.

FIG. 3A is a schematic depicting a combination of the first MEMS switch 12A, the second MEMS switch 12B, a third MEMS switch 12C, and a fourth MEMS switch 12D that realizes a MEMS-based two-input NOR gate 36. In this exemplary embodiment, the conductive pad 20A is electrically coupled to the anchor 18A such that the beam 16A is energized by a supply voltage, which in this exemplary embodiment is 40 V. The switch contact 22A is selectively pulled into electrical contact with the terminal contact 24A by electric static force generated by a voltage difference between the gate 28A and the beam 16A. When the switch contact 22A and the terminal contact 24A are in electrical contact, the first MEMS switch 12A is in the closed position. A voltage representing an input logic state is applied to the gate 28A though a first input terminal IN1.

Moreover, in this exemplary embodiment, the terminal contact 24A of the first MEMS switch 12A is electrically coupled to the conductive pad 20B of the second MEMS switch 12B. Further still, the terminal contact 24B of the second MEMS switch 12B is electrically coupled to the output terminal OUT1 through the resistor R1. When the switch contact 22B and the terminal contact 24B are in electrical contact, the second MEMS switch 12B is in the closed position. A voltage representing the input logic state at a second input terminal IN2 is applied to the gate 28B of the second MEMS switch 12B though the second input terminal IN2.

The third MEMS switch 12C includes a beam 16C having a fixed end attached to an anchor 18C. A conductive pad 20C is electrically coupled to the anchor 18C such that the beam 16C is held at a fixed voltage that is lower than the supply voltage. In this exemplary embodiment, the fixed voltage of the beam 16C is 0 V, which is depicted as ground. A free end of the beam 16C includes a switch contact 22C that is selectively pulled into electrical contact with a terminal contact 24C by electric static force generated by a voltage difference between a gate 28C and the beam 16C. When the switch contact 22C and the terminal contact 24C are in electrical contact, the third MEMS switch 12C is in the closed position. In this exemplary embodiment, the output terminal OUT1 is coupled directly to the terminal contact 24C. A voltage representing an input state at the second input terminal IN2 is applied to the gate 28C though the second input terminal IN2.

The fourth MEMS switch 12D includes a beam 16D having a fixed end attached to an anchor 18D. A conductive pad 20D is electrically coupled to the anchor 18D such that the beam 16D is held at a fixed voltage that is lower than the supply voltage. In this exemplary embodiment, the fixed voltage of the beam 16D is 0 V, which is depicted as ground. A free end of the beam 16D includes a switch contact 22D that is selectively pulled into electrical contact with a terminal contact 24D by electric static force generated by a voltage difference between a gate 28D and the beam 16D. When the switch contact 22D and the terminal contact 24D are in electrical contact, the fourth MEMS switch 12D is in the closed position. In this exemplary embodiment, the output terminal OUT1 is coupled directly to the terminal contact 24D. A voltage representing the input logic state at the first input terminal IN1 is applied to the gate 28D though the first input terminal IN1.

As further depicted in a Table 2 of FIG. 3B, an output state of 40 V is at the output OUT1 when an input state of 0 V is present at both the first input terminal IN1 and the second input terminal IN2. In particular, when an input logic state of 0 V is applied to the first input terminal IN1, a −40 V difference between the gate 28A and the beam 16A of the first MEMS switch 12A closes the first MEMS switch 12A, which in turn energizes the conductive pad 20B with the supply voltage of 40 V. If an input logic state of 0 V is simultaneously present at the second input terminal IN2, a −40 V difference between the gate 28B and the beam 16B of the second MEMS switch 12B closes the second MEMS switch 12B. With an input logic state of 0 V at the first input terminal IN1, a 0 V difference between the gate 28C of the third MEMS switch 12C and the beam 16C of the third MEMS switch 12C ensures that the third MEMS switch 12C is in the open position. Further still, with the input logic state of 0 V at the first input terminal IN1, a 0 V difference between the gate 28D of the fourth MEMS switch 12D and the beam 16D of the fourth MEMS switch 12D ensures that the fourth MEMS switch 12D is also in the open position. Thus, an output logic state of 40 V appears at the output terminal OUT1 with both the first MEMS switch 12A and the second MEMS switch 12B in the closed position while the third MEMS switch 12C and the fourth MEMS switch 12D are in the open position.

In contrast, an input logic state of 40 V at the second input terminal IN2 results in a 0 V difference between the gate 28B and the beam 16B of the second MEMS switch 12B, thereby ensuring the open position for the second MEMS switch 12B. However, the input logic state of 40 V at the second input terminal IN2 ensures that the third MEMS switch 12C is closed. As such, an output logic state of 0 V is applied to the output terminal OUT1 when the input logic state applied to the input terminal IN2 is 40 V, regardless of the input state of the first input IN1.

Moreover, an input logic state of 40 V at the first input terminal IN1 results in a 0 V difference between the gate 28A and the beam 16A of the first MEMS switch 12A, thereby ensuring the open position for the first MEMS switch 12A. However, the input logic state of 40 V at the first input terminal IN1 ensures that the fourth MEMS switch 12D is closed. As such, an output logic state of 0 V is applied to the output terminal OUT1 when the input logic state applied to the first input terminal IN1 is 40 V, regardless of the input state of the second input IN2.

Figures 4A, 4B:
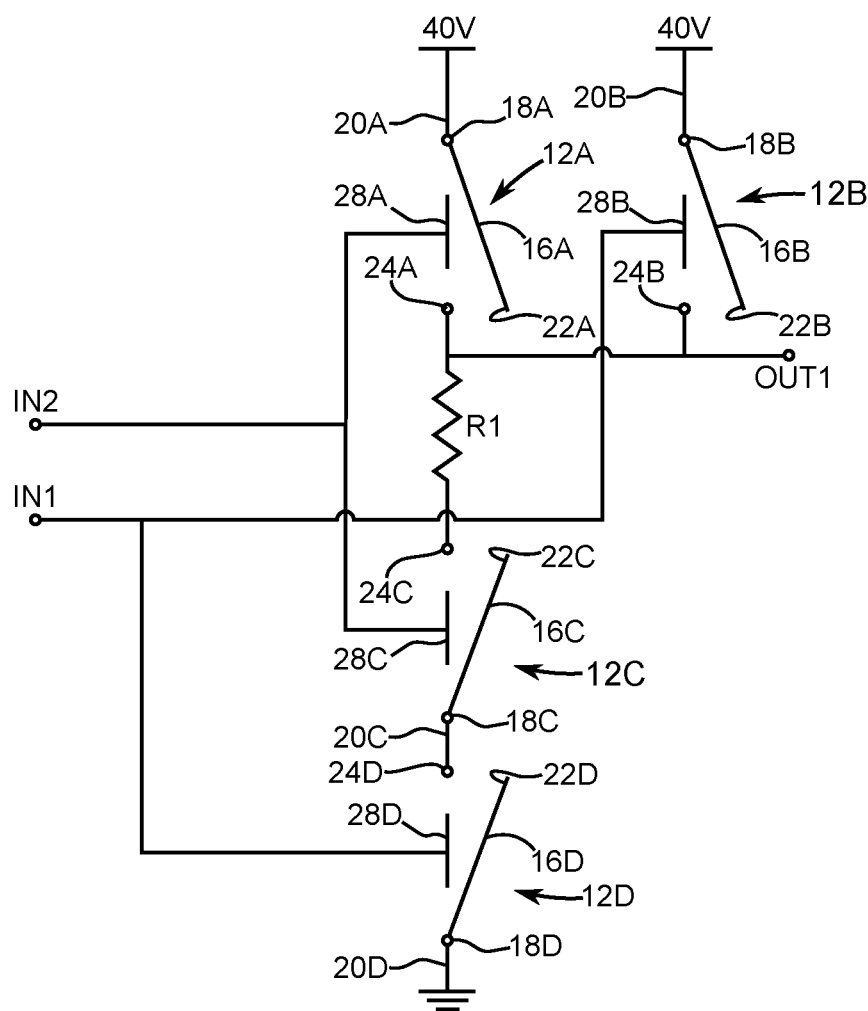
FIG. 4A is a schematic depicting a combination of MEMS switches that realizes a MEMS-based two-input NAND gate.
FIG. 4B is a logic table that lists input states and output states for the two-input NAND gate of FIG. 4A.

FIG. 4A is a schematic depicting a combination of MEMS switches that realizes a MEMS-based two-input NAND gate 38. In this exemplary embodiment, the conductive pad 20A of the first MEMS switch 12A and the conductive pad 20B of the second MEMS switch 12B are both electrically coupled to a supply voltage, which in this exemplary case is 40 V. The terminal contact 24A of the first MEMS switch 12A and the terminal contact 24B of the second MEMS switch 12B are both electrically coupled to the output terminal OUT1.

Moreover, in this exemplary embodiment the terminal contact 24C of the third MEMS switch 12C is electrically coupled to the terminal contact 24A of the first MEMS switch 12A through the resistor R1. It is to be understood that the resistor R1 is optional and is useful for protecting the MEMS switches 12A through 12D from excessive current shoot through in an unlikely event of inadvertent combination of switch closures that shorts the power supply voltage to ground. The resistor R1 does not contribute to logic function. Therefore, in some embodiments the terminal contact 24C of the third MEMS switch 12C may be electrically coupled to the terminal contact 24A of the first MEMS switch 12A directly.

The terminal contact 24D of the fourth MEMS switch 12D is electrically coupled to the conductive pad 20C of the third MEMS switch 12C, and the conductive pad 20D of the fourth MEMS switch 12D is coupled to a fixed voltage node having a lower voltage than the supply voltage. In this exemplary embodiment, the fixed voltage node is ground, which is at 0 V.

The gate 28A of the first MEMS switch 12A and the gate 28C of the third MEMS switch 12C are electrically coupled to the second input terminal IN2. The gate 28B of the second MEMS switch 12B and the gate 28D are electrically coupled to the first input terminal IN1.

As further depicted in a Table 3 of FIG. 4B, an output state of 40 V is at the output OUT1 when an input state of 0 V is present at either of the first input terminal IN1 or the second input terminal IN2. In particular, when an input logic state of 0 V is applied to the first input terminal IN1, a −40 V difference between the gate 28A and the beam 16A of the first MEMS switch 12A closes the first MEMS switch 12A, which in turn energizes the output terminal OUT1 with the supply voltage of 40 V. Moreover, with an input logic state of 0 V at the first input terminal IN1, a 0 V difference between the gate 28C of the third MEMS switch 12C and the beam 16C of the third MEMS switch 12C ensures that the third MEMS switch 12C is in the open position. Thus, an output logic state of 40 V appears at the output terminal OUT1 with either of the first MEMS switch 12A or the second MEMS switch 12B in the closed position while either of the third MEMS switch 12C or the fourth MEMS switch 12D is in the open position.

In contrast, an input logic state of 40 V at the second input terminal IN2 results in a 0 V difference between the gate 28B and the beam 16B of the second MEMS switch 12B, thereby ensuring the open position for the second MEMS switch 12B. However, the input logic state of 40 V at the second input terminal IN2 results in a 40 V difference between the gate 28C and the beam 16C, thereby ensuring that the third MEMS switch 12C is closed.

Moreover, an input logic state of 40 V at the first input terminal IN1 results in a 0 V difference between the gate 28A and the beam 16A of the first MEMS switch 12A, thereby ensuring the open position for the first MEMS switch 12A. However, the input logic state of 40 V at the first input terminal IN1 results in a 40 V difference between the gate 28D and the beam 16D, thereby ensuring that the fourth MEMS switch 12D is closed. As such, an output logic state of 0 V is applied to the output terminal OUT1 only when the input logic state of 40 V is applied to both the first input terminal IN1 and the second input terminal IN2 concurrently.

Figures 5A, 5B:
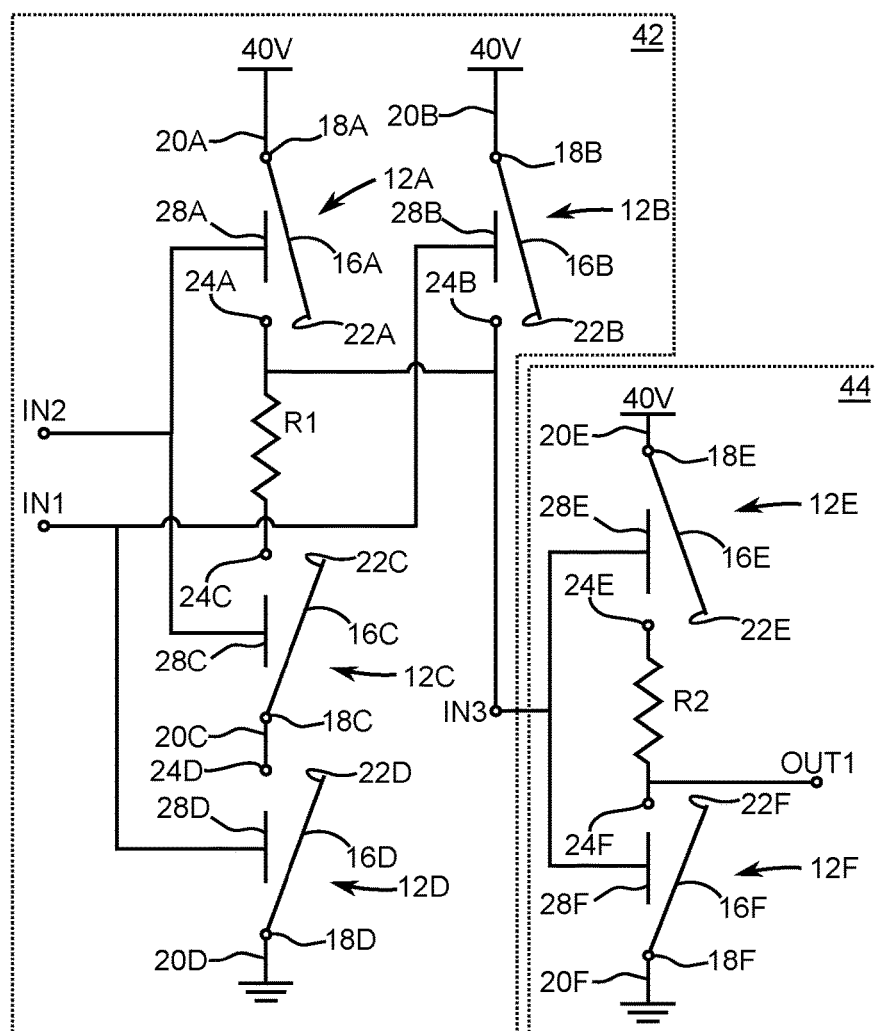
FIG. 5A is a schematic depicting a combination of MEMS switches that realizes a MEMS-based two-input AND gate.
FIG. 5B is a logic table that lists input states and output states for the two-input AND gate of FIG. 5A.

FIG. 5A is a schematic depicting a combination of MEMS switches that realizes a MEMS-based two-input AND gate 40. In the exemplary embodiment of FIG. 5A, a NAND logic gate section 42 that is equivalent to the MEMS-based two-input NAND gate 38 of FIG. 4A is combined with an inverter logic gate section 44 that is equivalent to the MEMS-based inverter gate 34 depicted in FIG. 2A. In particular, this exemplary embodiment adds a fifth MEMS switch 12E and a sixth MEMS switch 12F that are arranged into the inverter logic gate section 44.

The terminal contact 24A of the first MEMS switch 12A and the terminal contact 24B of the second MEMS switch 12B are electrically coupled to a gate 28E of the fifth MEMS switch 12E and to a gate 28F of the sixth MEMS switch 12F though an intermediate terminal IN3. The fifth MEMS switch 12E includes a beam 16E having a fixed end attached to an anchor 18E. A conductive pad 20E is electrically coupled to the anchor 18E such that the beam 16E is energized by a supply voltage, which in this exemplary embodiment is 40 V. A free end of the beam 16E includes a switch contact 22E that is selectively pulled into electrical contact with a terminal contact 24E by electric static force generated by a voltage difference between the gate 28E and the beam 16E. When the switch contact 22E and the terminal contact 24E are in electrical contact, the fifth MEMS switch 12E is in the closed position. A voltage representing an input logic state of the inverter logic gate section 44 is applied to the gate 28E though the intermediate terminal IN3. The output terminal OUT1 is electrically coupled to the terminal contact 24E through an optional resistor R2, which may have a resistance value between a kilo-ohm and mega-ohm range to limit current flow through the fifth MEMS switch 12E and the sixth MEMS switch 12F when either is in the closed position. Voltage at the output terminal OUT1 represents an output logic state of the MEMS-based AND gate 40.

The sixth MEMS switch 12F includes a beam 16F having a fixed end attached to an anchor 18F. A conductive pad 20F is electrically coupled to the anchor 18F such that the beam 16F is held at a fixed voltage that is lower than the supply voltage. In this exemplary embodiment, the fixed voltage of the beam 16F is 0 V, which is depicted as ground. A free end of the beam 16F includes a switch contact 22F that is selectively pulled into electrical contact with a terminal contact 24F by electric static force generated by a voltage difference between a gate 28F and the beam 16F. When the switch contact 22F and the terminal contact 24F are in electrical contact, the sixth MEMS switch 12F is in the closed position. In this exemplary embodiment, the output terminal OUT1 is coupled directly to the terminal contact 24F. Voltage representing the input logic state is applied to the gate 28F though the intermediate terminal IN3.

As further depicted in a Table 4 of FIG. 5B, an output state of 0 V is at the output OUT1 when an input state of 0 V is present at either of the first input terminal IN1 or the second input terminal IN2. In particular, when an input logic state of 0 V is applied to the first input terminal IN1, a −40 V difference between the gate 28A and the beam 16A of the first MEMS switch 12A closes the first MEMS switch 12A, which in turn energizes the output terminal OUT1 with the supply voltage of 40 V. Moreover, with an input logic state of 0 V at the first input terminal IN1, a 0 V difference between the gate 28C of the third MEMS switch 12C and the beam 16C of the third MEMS switch 12C ensures that the third MEMS switch 12C is in the open position. Thus, an output logic state of 40 V appears at the intermediate terminal IN3 with either of the first MEMS switch 12A or the second MEMS switch 12B in the closed position while either of the third MEMS switch 12C or the fourth MEMS switch 12D is in the open position.

The 40 V logic state at the intermediate terminal IN3 results in a 0 V difference between the gate 28E of the fifth MEMS switch 12E and the beam 16E of the fifth MEMS switch 12E. As a result, the fifth MEMS switch 12E is in the open state. In contrast, the 40 V logic state at the intermediate terminal IN3 results in a 40 V difference between the gate 28F and the beam 16F of the sixth MEMS switch 12F. As a result, the sixth MEMS switch 12F is in the closed position, which ensures that the output terminal OUT1 is at the logic state of 0 V.

In contrast, an input logic state of 40 V at the second input terminal IN2 results in a 0 V difference between the gate 28B and the beam 16B of the second MEMS switch 12B, thereby ensuring the open position for the second MEMS switch 12B. However, the input logic state of 40 V at the second input terminal IN2 results in a 40 V difference between the gate 28C and the beam 16C, thereby ensuring that the third MEMS switch 12C is closed.

Moreover, an input logic state of 40 V at the first input terminal IN1 results in a 0 V difference between the gate 28A and the beam 16A of the first MEMS switch 12A, thereby ensuring the open position for the first MEMS switch 12A. However, the input logic state of 40 V at the first input terminal IN1 results in a 40 V difference between the gate 28D and the beam 16D, thereby ensuring that the fourth MEMS switch 12D is closed. As such, an output logic state of 0 V is applied to the intermediate terminal IN3 only when the input logic state of 40 V is applied to both the first input terminal IN1 and the second input terminal IN2 concurrently.

The 0 V logic state at the intermediate terminal IN3 results in a −40 V difference between the gate 28E of the fifth MEMS switch 12E and the beam 16E of the fifth MEMS switch 12E. As a result, the fifth MEMS switch 12E is in the closed state. In contrast, the 0 V logic state at the intermediate terminal IN3 results in a 0 V difference between the gate 28F and the beam 16F of the sixth MEMS switch 12F. As a result, the sixth MEMS switch 12F is in the open position, which ensures that the output terminal OUT1 is at the logic state of 40 V.

It is to be understood that the MEMS switches 12A through 12F are relatively small in comparison to RF MEMS switches used to switch RF signals. For example, in at least some embodiments, the NAND logic gate section 42 depicted in FIG. 5A takes up no more area than 80 µm by 40 µm when integrated into a chip die. Moreover, in at least some embodiments, inverter logic section 44 depicted in FIG. 5A takes up no more area than 40 µm by 40 µm when integrated into a chip die.

Figure 6:
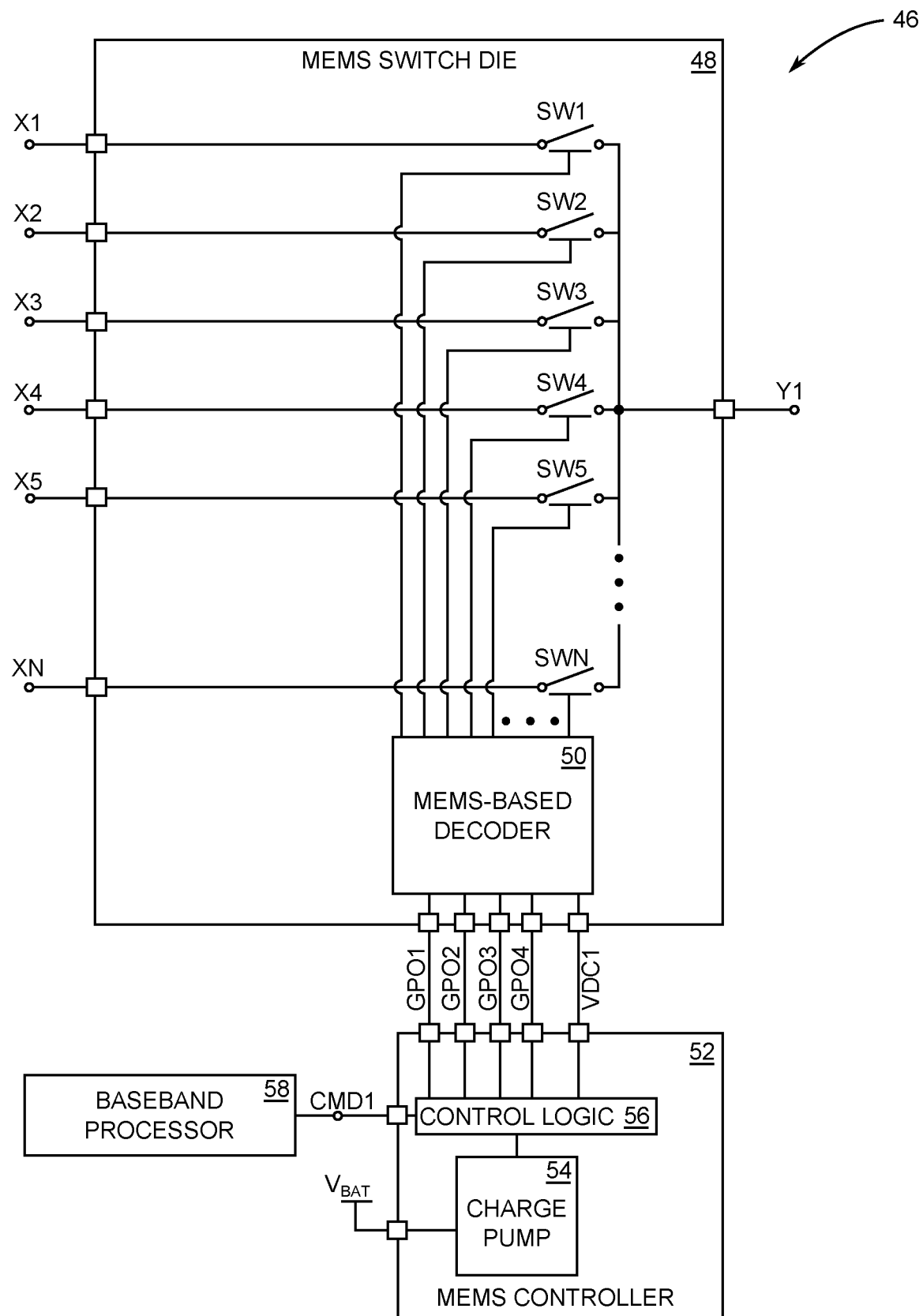
FIG. 6 is a schematic depicting a MEMS switch system that includes a MEMS switch die in which radio frequency (RF) MEMS switches are integrated with a MEMS-based decoder configured to selectively open and close the RF MEMS switches.

In this regard, FIG. 6 is a schematic depicting a MEMS switch system 46 that includes a MEMS switch die 48 in which an N number of RF MEMS switches SW1 through SWN are integrated with a MEMS-based decoder 50 onto a common substrate such as substrate 14 depicted in related-art FIGS. 1A and 1B. For the purpose of this disclosure, N is a natural counting number greater than one.

The RF MEMS switches SW1 through SWN are coupled in series between corresponding ones of signal terminals X1 through XN and a common signal terminal Y1. For example, in operation an RF signal applied to a signal terminal X2 passes to the common terminal Y1 if the RF MEMS switch SW2 is in the closed position. Moreover, an RF signal applied to the Y1 terminal is passed to a selected one of signal terminals X3, X4, or X5 depending on which one of the RF MEMS switches SW3, SW4, and SW5 is selectively driven to closure by the MEMS-based decoder 50. A benefit of the MEMS-based decoder 50 is a relatively large reduction in traditionally required controlled lines. For example, an N number of RF MEMS switches such as RF MEMS switches SW1 through SWN ordinarily requires an N number of control lines. The MEMS-based decoder 50 is made up of MEMS-based logic gates such as the MEMS-based inverter gate 34, the MEMS-based two-input NOR gate 36, the MEMS-based two-input NAND gate 38, and the MEMS-based two-input AND gate 40 of FIGS. 2A, 3A, 4A, and 5A, respectively. However, it is to be understood that the MEMS decoder 50 may include other types of MEMS-based logic gates such as OR gates, XOR gates, XNOR gates, and logic gates having inputs greater than two. Moreover, it is to be understood that all logic gate functions may be realized by combining pluralities of MEMS-based NAND gates such as MEMS-based NAND gate 38 depicted in FIG. 4A. The logic gates comprised of logic MEMS switches such the MEMS switches 12A through 12F depicted in FIG. 5A.

The MEMS-based decoder 50 is configured to receive coded signals over a general purpose control bus, which in this exemplary embodiment includes four control lines GPO1, GPO2, GPO3, and GPO4. A mathematical relationship for determining a number of control lines K needed for controlling the switching of N number of RF MEMS switches SW1 through SWN is provided in equation 1, wherein K is a natural counting number.

$$N = 2^K - 1 \qquad \text{EQ. 1}$$

For example, if the N number of RF MEMS switches is 15, the K number of control lines is 4. However, it is to be understood that more K number of control lines may be added to control up to N number of RF MEMS switches SW1 through SWN.

The MEMS-based decoder 50 is further configured to receive a gate driving voltage VDC1 that is applied to gate electrodes of selected ones of the RF MEMS switches SW1 through SWN based upon decoding of signals received over the general purpose bus by the MEMS-based decoder 50. The MEMS switch system 46 also includes a MEMS controller 52 that integrates a charge pump 54 and control logic 56 for generating and sending the coded signals over the general purpose bus to the MEMS-based decoder 50. The gate driving voltage VDC1 is generated by the charge pump 54 and in some embodiments is the same voltage used to drive the inputs of the MEMS-based logic gates of the MEMS-based decoder 50.

The MEMS switch system 46 may further include a baseband processor 58 that is configured to determine which of the RF MEMS switches SW1 through SWN should be opened and closed based upon criteria such as RF band of operation and power levels of the RF signals to be passed by the MEMS switch die 48. The baseband processor 58 is further configured to generate and issue commands to the control logic 56 though a command output CMD1 based upon a determination of which of the RF MEMS switches SW1 through SWN should be opened and/or closed. The charge pump 54 is configured to boost the voltage of a source voltage such as a battery voltage $V_{BAT}$ to provide a charge pump voltage of 40 V. In the exemplary embodiments, the battery voltage $V_{BAT}$ ranges between 3.7 V charged and 3.4 V discharged. In the exemplary embodiments, the charge pump 54 is configured to generate the charge pump voltage of 40 V from the battery voltage $V_{BAT}$ between the charged voltage of 3.7 V and the discharge voltage of 3.4 V. It is to be understood that the charge pump voltage may be higher or lower than the exemplary 40 V, and the charged voltage and discharge voltage $V_{BAT}$ may be higher or lower than the exemplary charged 3.7 V and the exemplary discharged voltage of 3.4 V. The charge pump voltage is passed through the control logic 56 to the MEMS-based decoder 50 over the control lines, which in the exemplary case are control lines GPO1 through GPO4 that control the switch states of up to 15 RF MEMS switches.

In this regard, FIG. 7 is a truth table (Table 5) listing logic states of 16 coded signals conveyed over the control lines GPO1 through GPO4 along with switch states for 15 RF MEMS switches SW1 through SW15 in response to the coded signals. In the exemplary embodiments, a logic state of 0 is realized by 0 V and a logic state of 1 is realized by 40 V.

Figure 8:
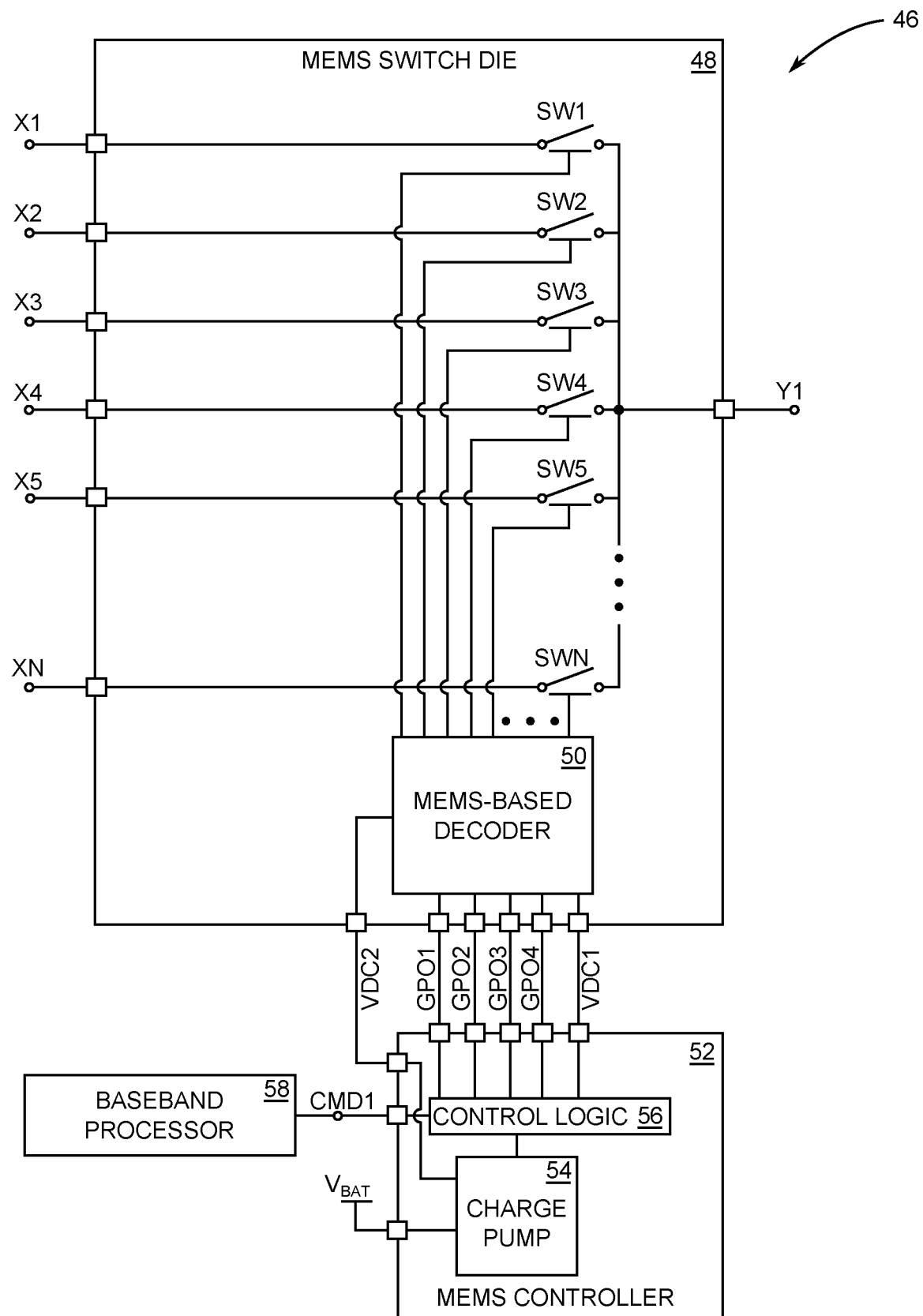
FIG. 8 is a schematic depicting a modified version of the MEMS switch system of FIG. 6 in which a charge pump is configured to generate a second gate driving voltage for the MEMS-based decoder.

FIG. 8 is a schematic depicting a modified version of the MEMS switch system 46 in which the charge pump 54 is further configured to generate a second gate driving voltage VDC2 for the MEMS-based decoder 50. This exemplary embodiment is useful in applications in which different gate drive voltage levels are desired. For example, a voltage level for the gate driving voltage VDC1 generated by the charge pump 54 may be twice the voltage level generated for the second gate driving voltage VDC2, and vice versa.

Figure 9:
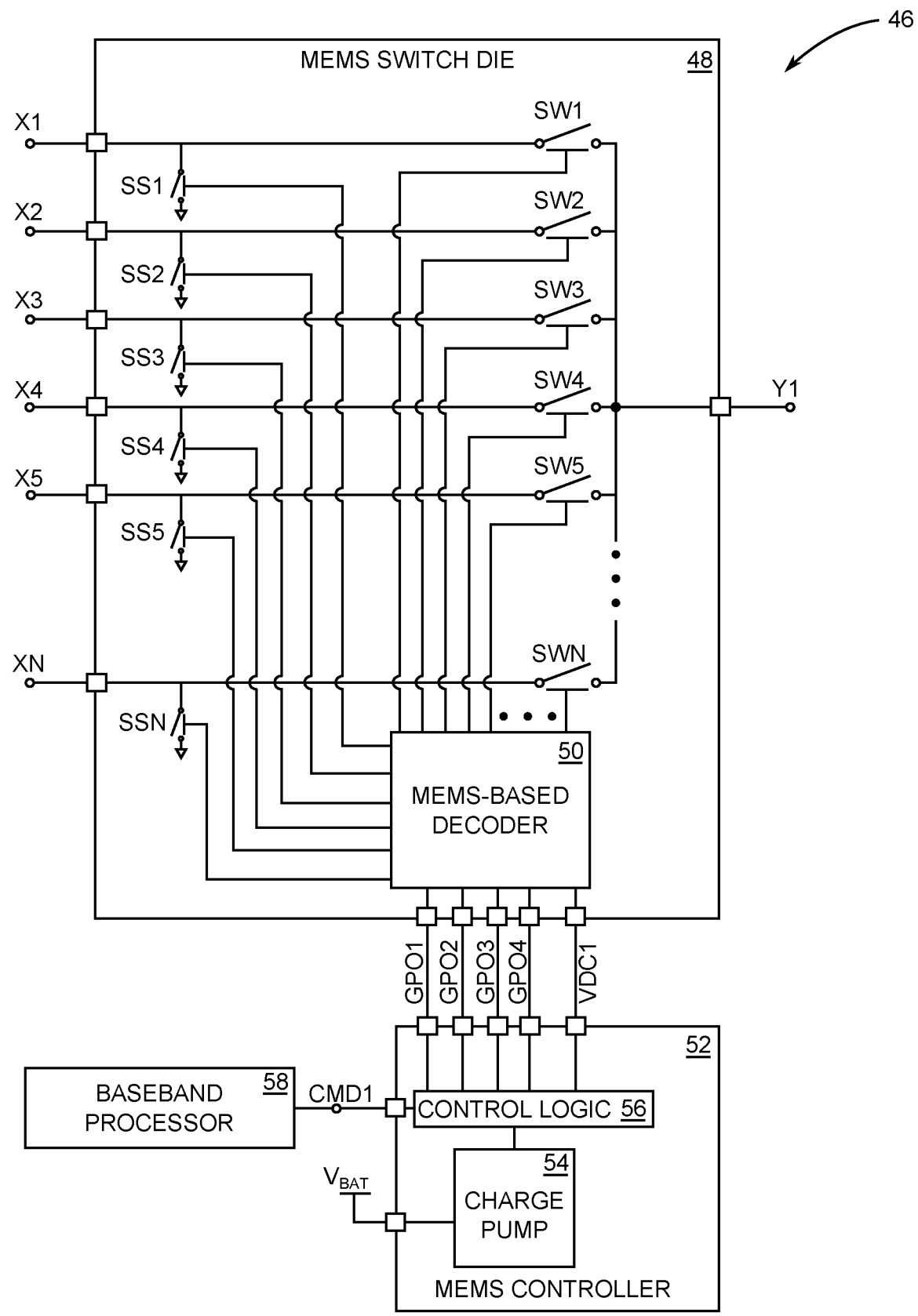
FIG. 9 is a schematic depicting another modified version of the MEMS switch system of FIG. 6 in which shunt MEMS switches are integrated into the MEMS switch die to improve isolation of the RF MEMS switches.

FIG. 9 is a schematic depicting another modified version of the MEMS switch system 46 of FIG. 6 in which shunt MEMS switches are integrated into the MEMS switch die 48 to improve isolation of the RF MEMS switches SW1 through SWN. In particular, FIG. 9 depicts a modified version of the MEMS switch system 46 in which shunt MEMS switches SS1 through SSN are electrically coupled between corresponding ones of signal terminals X1 through XN and a fixed voltage node, which in this exemplary embodiment is signal ground. When the RF MEMS switches SW1 through SWN are open, the shunt MEMS switches SS1 through SSN can be commanded closed to improve isolation between the signal terminals X1 through XN and the common terminal Y1. For example, isolation is improved if the shunt MEMS switches SS2, SS3, SS4, and SS5 are closed when RF MEMS switches SW2, SW3, SW4, and SW5 are open.

In this regard, FIG. 10 is a truth table (Table 6) listing logic states of 16 coded signals conveyed over the control lines GPO1 through GPO4 along with switch states for 15 RF MEMS switches SW1 through SW15 and along with switch states for 15 shunt MEMS switches SS1 through SSN in response to the coded signals. Notice from Table 6 that in this exemplary embodiment, the RF MEMS switches and the shunt MEMS switches have opposite switch states for every coded signal. In other words, whenever the RF MEMS switches SW1 through SW15 are open, the shunt MEMS switches SS1 through SSN are closed, and vice versa.

Figure 11:
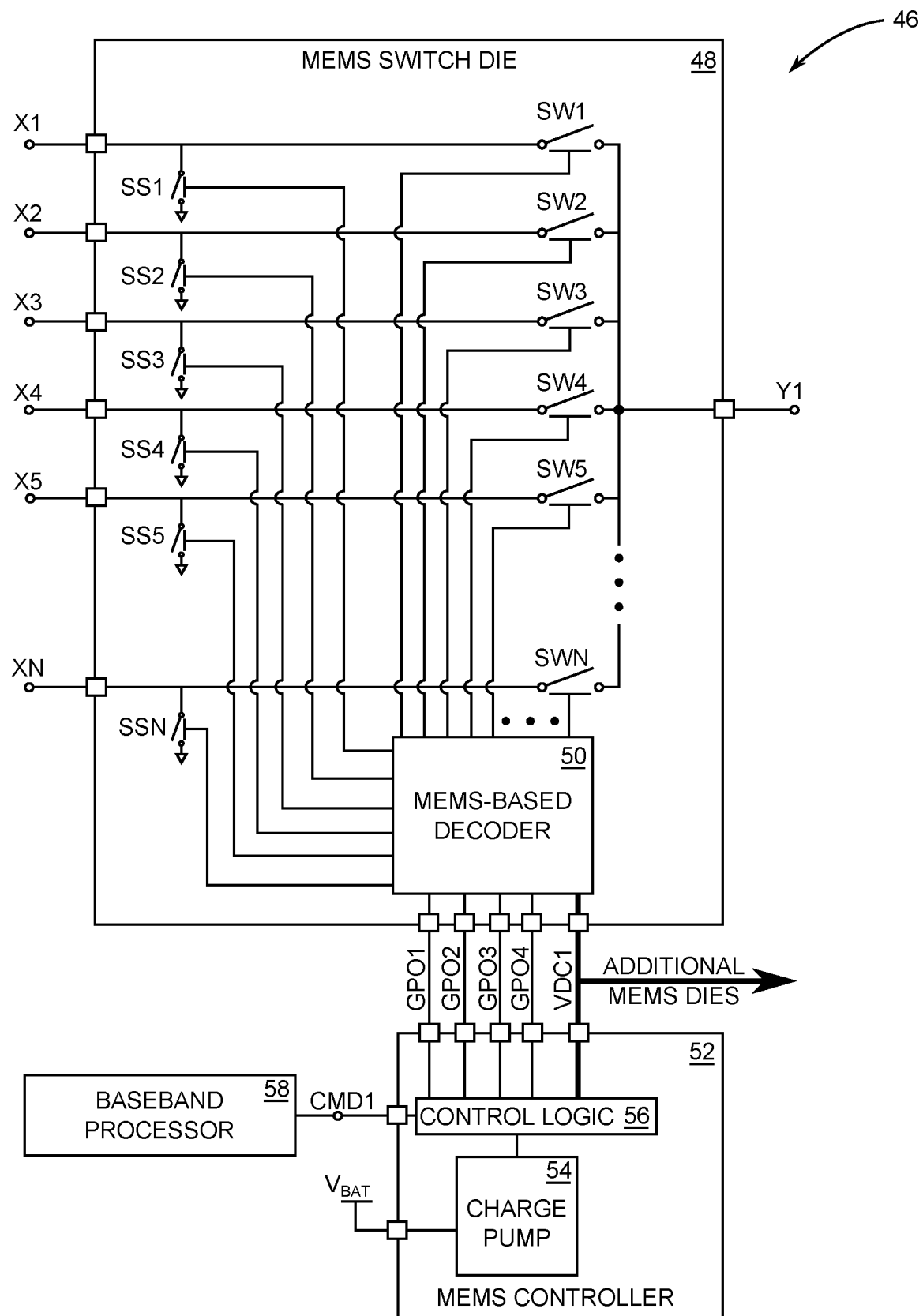
FIG. 11 is a schematic depicting another modified version of the MEMS switch system of FIG. 6 in which the charge pump is further configured to provide the gate driving voltage to additional MEMS dies (not shown).

FIG. 11 is a schematic depicting another modified version of the MEMS switch system 46 of FIG. 6 in which the charge pump 54 is further configured to provide the gate driving voltage VDC1 to additional MEMS dies (not shown). The additional capacity of the charge pump 54 is illustrated by the bold trace coupling the gate driving voltage VDC1 between the control logic 56 and the MEMS-based decoder 50. While transmission of the gate driving voltage VDC1 is depicted as controlled by the control logic 56, it is to be understood that the gate driving voltage VDC1 may bypass the control logic 56 and instead be provided directly from the charge pump 54. Moreover, the gate driving voltage VDC1 can be a variable voltage that is increased during a first time period and then decreased during a second time period to a target voltage in order to decrease switching time of the RF MEMS switches SW1 through SWN. The increased voltage of the gate driving voltage VDC1 during the first time period accelerates the beam 16 (related-art FIGS. 1A and 1B) towards the terminal contact 24, and then the decreased voltage of the gate driving voltage VDC1 relaxes the acceleration so that the switch contact 22 does not bounce after coming into initial contact with the terminal contact 24.

Those skilled in the art will recognize improvements and modifications to the preferred embodiments of the present disclosure. All such improvements and modifications are considered within the scope of the concepts disclosed herein and the claims that follow.

What is claimed is:

1. A microelectromechanical systems (MEMS) switch die comprising:
    an N number of radio frequency (RF) MEMS switches, each having an RF beam with an RF switch contact, an RF gate, and an RF terminal contact, wherein N is a counting number;
    a MEMS-based decoder comprising a first logic MEMS switch, a second logic MEMS switch, and an internal logic gate circuitry, the MEMS-based decoder configured to:
        decode coded signals to determine which of the N number of RF MEMS switches to open and close;
        apply a higher gate voltage to each RF gate of the RF MEMS switches determined to be closed, wherein the higher gate voltage electrostatically pulls the RF beam and brings the RF switch contact into electrical contact with the RF terminal contact; and
        apply a lower gate voltage to each RF gate of the RF MEMS switches to be opened, wherein the lower gate voltage releases the RF beam and allows the RF switch contact to break electrical contact with the RF terminal contact; and wherein,
    the first logic MEMS switch has a first beam with a first switch contact, a first gate, and a first terminal contact, wherein the first beam is coupled to a fixed higher voltage node;
    the second logic MEMS switch has a second beam with a second switch contact, a second gate, and a second terminal contact, wherein the second beam is electrically coupled to a fixed lower voltage node; and
    the internal logic gate circuitry has a first input terminal and a first output terminal, wherein the internal logic gate circuitry is electrically coupled between the first terminal contact of the first logic MEMS switch and the second terminal contact of the second logic MEMS switch.

2. The MEMS switch die of claim 1 wherein a lower voltage of the fixed lower voltage node applied to the first gate and a higher voltage of the fixed higher voltage node provides a voltage difference that electrostatically pulls the first beam such that the first switch contact comes into electrical contact with the first terminal contact.

3. The MEMS switch die of claim 1 wherein a higher voltage of the fixed higher voltage node applied to the second gate and a lower voltage of the fixed lower voltage node provides a voltage difference that electrostatically pulls the second beam such that the second switch contact comes into electrical contact with the second terminal contact.

4. The MEMS switch die of claim 1 wherein a voltage difference between the fixed higher voltage node and the fixed lower voltage node is between 40 V and 80 V.

5. The MEMS switch die of claim 1 wherein the internal logic gate circuitry electrically couples the first input terminal to both the first gate and the second gate and electrically couples the first output terminal to both the first terminal contact and the second terminal contact to configure the MEMS logic gate as an inverter gate.

6. The MEMS switch die of claim 1 wherein the internal logic gate circuitry further comprises:
    a second input terminal;
    a third logic MEMS switch having a third beam with a third switch contact electrically coupled to the first terminal contact, a third gate electrically coupled to the second input terminal, and a third terminal contact electrically coupled to the first output terminal; and
    a fourth logic MEMS switch having a fourth beam with a fourth switch contact electrically coupled to the fixed lower voltage node, a fourth gate coupled to the first input terminal, and a fourth terminal contact electrically coupled to the first output terminal.

7. The MEMS switch die of claim 6 wherein the first gate of the first logic MEMS switch is coupled to the first input terminal and the second gate of the second logic MEMS switch is coupled to the second input terminal to configure the MEMS logic gate as a NOR gate.

8. The MEMS switch die of claim 1 wherein the internal logic gate circuitry further comprises:
    a second input terminal;
    a third logic MEMS switch having a third beam with a third switch contact electrically coupled to the fixed higher voltage node, a third gate electrically coupled to the first input terminal, and a third terminal contact electrically coupled to the first output terminal; and
    a fourth logic MEMS switch having a fourth beam with a fourth switch contact electrically coupled to the second terminal contact of the second logic MEMS switch, a fourth gate coupled to the second input terminal, and a fourth terminal contact electrically coupled to the first output terminal.

9. The MEMS switch die of claim 8 wherein the first gate of the first logic MEMS switch is coupled to the second input terminal and the second gate of the second logic MEMS switch is coupled to the first input terminal to configure the MEMS logic gate as a NAND gate.

10. The MEMS switch die of claim 7 wherein the internal logic gate circuitry further comprises:
    a second output terminal;
    a fifth logic MEMS switch having a fifth beam with a fifth switch contact, a fifth gate coupled to the first output terminal, and a fifth terminal contact coupled to the second output terminal, wherein the fifth beam is coupled to the fixed higher voltage node;
    a sixth logic MEMS switch having a sixth beam with a sixth switch contact, a sixth gate coupled to the first output terminal, and a sixth terminal contact coupled to the second output terminal, wherein the sixth beam is electrically coupled to the fixed lower voltage node to configure the MEMS logic gate as an AND gate.

11. The MEMS switch die of claim 1 wherein the MEMS logic gate includes a NAND logic gate section.

12. The MEMS switch die of claim 11 wherein the NAND logic gate section takes up no more area than 80 µm by 40 µm of the MEMS switch die.

13. The MEMS switch die of claim 1 wherein the MEMS logic gate includes an inverter logic gate section.

14. The MEMS switch die of claim 1 further including a plurality of signal terminals wherein the N number of RF MEMS switches are electrically coupled between individual corresponding ones of the plurality of signal terminals and at least one other signal terminal that is not one of the plurality of signal terminals.

15. The MEMS switch die of claim 14 further comprising a plurality of shunt MEMS switches, one for each of the N number of RF MEMS switches, in which a corresponding one of the plurality of shunt MEMS switches is electrically coupled between corresponding ones of the plurality of signal terminals and a fixed voltage node.

16. The MEMS switch die of claim 15 wherein the fixed voltage node is ground.

17. The MEMS switch die of claim 15 wherein the MEMS-based decoder is further configured to open corresponding ones of the plurality of shunt MEMS switches before closing corresponding ones of the N number of RF MEMS switches.

18. The MEMS switch die of claim 15 wherein the MEMS-based decoder is further configured to open corresponding ones of the N number of RF MEMS switches before closing corresponding ones of the plurality of shunt MEMS switches.

19. The MEMS switch die of claim 1 wherein a number of control lines K needed for controlling the switching of N number of RF MEMS switches is provided in an equation $N=2^K-1$, wherein K is a natural counting number.

* * * * *